United States Patent
Takinami et al.

(10) Patent No.: US 8,222,939 B2
(45) Date of Patent: Jul. 17, 2012

(54) METHOD AND SYSTEM FOR A GLITCH CORRECTION IN AN ALL DIGITAL PHASE LOCK LOOP

(75) Inventors: Koji Takinami, Yokohama (JP); Richard Strandberg, Fremont, CA (US); Paul Cheng-Po Liang, TaiChung (TW)

(73) Assignee: Panasonic Corporation, Osaka (JP)

( * ) Notice: Subject to any disclaimer, the term of this patent is extended or adjusted under 35 U.S.C. 154(b) by 164 days.

(21) Appl. No.: 12/838,754

(22) Filed: Jul. 19, 2010

(65) Prior Publication Data

US 2012/0013363 A1    Jan. 19, 2012

(51) Int. Cl.
*H03L 7/06* (2006.01)

(52) U.S. Cl. .......... 327/159; 327/34; 327/156; 375/373; 331/16

(58) Field of Classification Search .................. 327/156, 327/159; 331/16; 375/373
See application file for complete search history.

(56) References Cited

U.S. PATENT DOCUMENTS

| | | | | |
|---|---|---|---|---|
| 6,738,922 B1* | 5/2004 | Warwar et al. | ................ | 713/503 |
| 7,158,596 B2* | 1/2007 | Knapp et al. | ................ | 375/356 |
| 7,907,023 B2* | 3/2011 | Liang et al. | ................ | 331/45 |
| 2008/0068236 A1* | 3/2008 | Sheba et al. | ................ | 341/118 |
| 2009/0267664 A1* | 10/2009 | Uozumi et al. | ................ | 327/158 |
| 2010/0033220 A1* | 2/2010 | Zhang | ................ | 327/159 |
| 2011/0057738 A1* | 3/2011 | Titus | ................ | 331/1 A |

* cited by examiner

*Primary Examiner* — Ryan Jager

(57) ABSTRACT

The present invention relates to a method and system for glitch correction in an all digital phase lock loop. An all digital phase lock loop can include a phase error signal generation unit, a multi-phase oscillator, a glitch correction unit, and a phase to digital converter. The phase to digital converter receives a multi-phase signal from the multi-phase oscillator and generates a phase signal. The error signal generation unit receives the phase signal and a reference phase signal and generates a phase error signal, which is fed to the glitch correction unit. The glitch correction unit removes the glitches in the phase error signal by a portion of the phase error signal. The phase lock loop can also include a phase rotator and a calibration block. The calibration block instructs the phase rotator to rotate the multi-phase signal by the phase rotation which generates the minimum number of glitches.

24 Claims, 16 Drawing Sheets

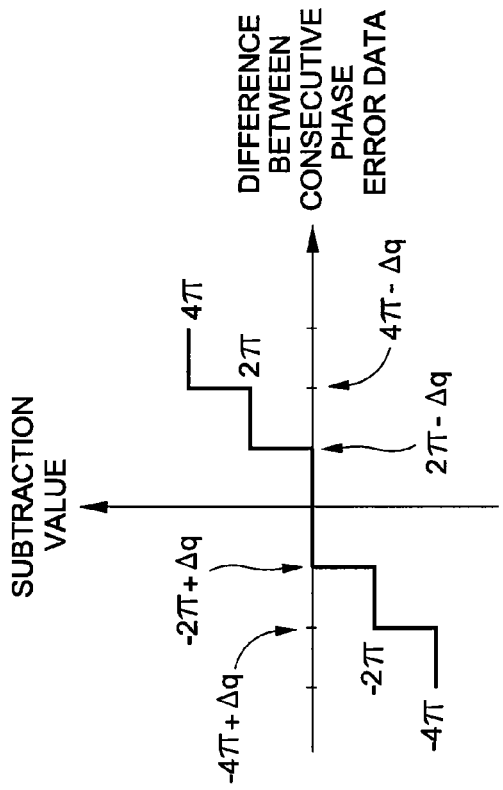
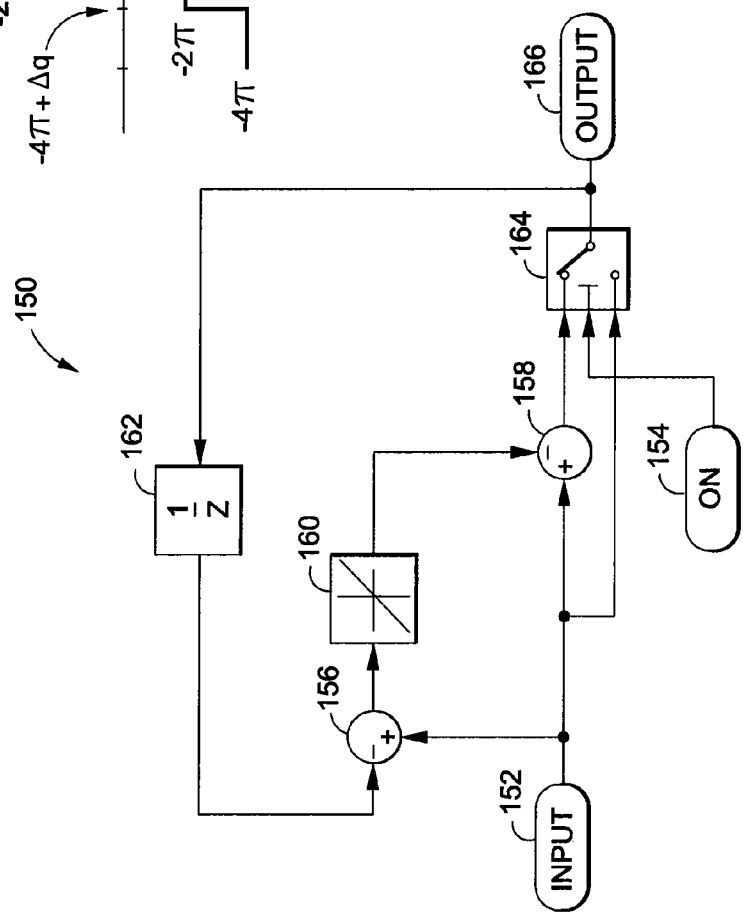
FIG. 10
FIG. 9

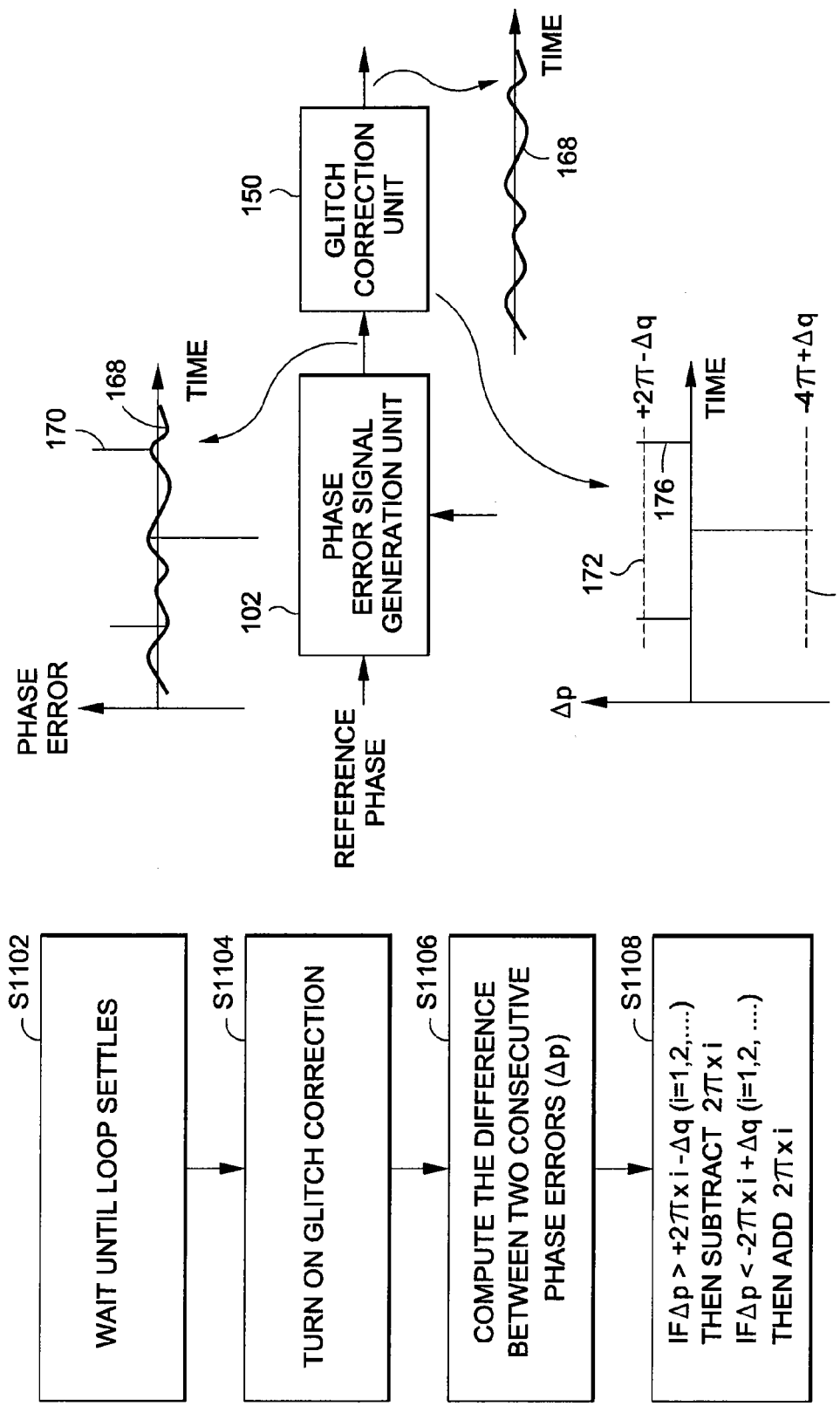

| PHASE (deg) \ TAP | 0 – 22.5 | 22.5 – 45 | 45 – 67.5 | 67.5 – 90 | 90 – 112.5 | 112.5 – 135 | 135 – 157.5 | 175.5 – 180 | 180 – 202.5 | 202.5 – 225 | 225 – 247.5 | 247.5 – 270 | 270 – 292.5 | 292.5 – 315 | 315 – 337.5 | 337.5 – 360 |
|---|---|---|---|---|---|---|---|---|---|---|---|---|---|---|---|---|
| P1 | 1 | 1 | 1 | 1 | 1 | 1 | 1 | 1 | 0 | 0 | 0 | 0 | 0 | 0 | 0 | 0 |
| P2 | 0 | 1 | 1 | 1 | 1 | 1 | 1 | 1 | 1 | 0 | 0 | 0 | 0 | 0 | 0 | 0 |
| P3 | 0 | 0 | 1 | 1 | 1 | 1 | 1 | 1 | 1 | 1 | 0 | 0 | 0 | 0 | 0 | 0 |
| P4 | 0 | 0 | 0 | 1 | 1 | 1 | 1 | 1 | 1 | 1 | 1 | 0 | 0 | 0 | 0 | 0 |
| P5 | 0 | 0 | 0 | 0 | 1 | 1 | 1 | 1 | 1 | 1 | 1 | 1 | 0 | 0 | 0 | 0 |
| P6 | 0 | 0 | 0 | 0 | 0 | 1 | 1 | 1 | 1 | 1 | 1 | 1 | 1 | 0 | 0 | 0 |
| P7 | 0 | 0 | 0 | 0 | 0 | 0 | 1 | 1 | 1 | 1 | 1 | 1 | 1 | 1 | 0 | 0 |
| P8 | 0 | 0 | 0 | 0 | 0 | 0 | 0 | 1 | 1 | 1 | 1 | 1 | 1 | 1 | 1 | 0 |

FIG. 22

METHOD AND SYSTEM FOR A GLITCH CORRECTION IN AN ALL DIGITAL PHASE LOCK LOOP

BACKGROUND

1. Field of the Invention

The present invention relates to a method and system for glitch correction in an all digital phase lock loop.

2. Description of Related Art

Conventional all digital phase lock loops utilizing a multi-phase oscillator generate a fractional phase signal and an integer phase signal which are summed to form a phase signal. The phase signal is compared with a reference phase signal and the difference is taken to determine a phase error signal. However, in generating the fractional phase signal and the integer phase signal, conventional phase lock loops can have two different paths.

The two different paths can have different delay times in generating the fractional phase signal or the integer phase signal when clocked by a reference clock signal. This can result in the fractional phase signal and the integer phase signal being misaligned. The misalignment in the fractional phase signal and the integer phase signal can be problematic since the sum is used to generate the phase signal. The phase signal can have glitches where the integer phase signal has already been incremented, but the fractional phase signal has not yet been reset to 0. This leads to the phase signal being off by the increment of the integer phase signal since the integer phase signal was prematurely incremented for a short period of time.

Such glitches in the phase signal are propagated through to the phase error signal and can reduce the efficiency and/or the performance of the phase lock loop. In addition, the phase lock loop may encounter problems when attempting to remain in compliance with a specification, such as those propagated by the 3rd Generation Partnership Project ("3GPP").

Thus, there is a need for a method and system for glitch correction in an all digital phase lock loop.

SUMMARY OF THE INVENTION

The present invention relates to a method and system for glitch correction in an all digital phase lock loop. In one embodiment, a phase lock loop includes a phase error signal generation unit, a multi-phase oscillator, a glitch correction unit, and a phase to digital converter. The phase to digital converter receives multi-phase outputs from the multi-phase oscillator and generates a digital phase signal. The phase error signal generation unit receives the phase signal and a reference phase signal and determines a difference between the two to generate a phase error signal, which is fed to the glitch correction unit.

The glitch correction unit can remove the glitches in the phase error signal. The glitch correction unit can analyze the difference between consecutive phase error data to determine if the difference is greater than a predetermined phase error threshold. If the difference is greater than a predetermined phase error threshold, then one of the predetermined phase error data contains a glitch and a lookup table can be used to determine a subtraction value. The subtraction value can be subtracted from the consecutive phase error data containing the glitch to correct the phase error data.

The glitch correction unit can also analyze the phase error data directly to determine if the phase error data is greater than a predetermined phase error threshold. If the phase error data is greater than a predetermined phase error threshold, then the phase error data contains a glitch, and a lookup table can be used to determine the subtraction value. The subtraction value can be subtracted from the phase error data to correct the phase error data.

Alternatively, the glitch correction unit can discard the integer phase error of the phase error data and only analyze the fractional phase error of the phase error data.

In addition, the phase lock loop can also include a phase rotator and a calibration block. The calibration block can be connected to the glitch correction unit and the phase rotator. The calibration block can determine the number of glitches in the phase error signal for a predetermined period of time for each phase rotation of the multi-phase signal. The calibration block can instruct the phase rotator to rotate the multi-phase signal from the multi-phase oscillator by a plurality of phase rotations and generate a glitch graph mapping the number of glitches for a particular phase rotation. Using the glitch graph, the calibration block can determine which phase rotation generates the minimum number of glitches and can therefore instruct the phase rotator to rotate the multi-phase signal by the phase rotation which generates the minimum number of glitches. This can reduce the number of glitches in the phase error signal.

In addition, the glitch correction unit, the integer phase generation portion of the phase to digital converter (counter), and/or the calibration block can be selectively activated or deactivated in order to increase energy efficiency of the phase lock loop.

In one embodiment, the present invention is an all digital phase lock loop including a phase error signal generation unit generating a phase error signal including a plurality of phase error data, and a glitch correction unit connected to the phase error signal generation unit and configured to remove glitches in the phase error signal.

In another embodiment, the present invention is an all digital phase lock loop comprising a multi-phase oscillator generating a multi-phase signal, a phase rotator connected to the multi-phase oscillator and rotating the multi-phase signal by one of a plurality of phase rotations, and a calibration block connected to the phase rotator and counting a number of glitches in a phase error signal for a predetermined period of time for each of the plurality of phase rotations.

In yet another embodiment, the present invention is a method for removing glitches in a phase error signal including generating a phase error signal including a plurality of phase error data, and correcting one or more of the plurality of phase error data to remove the glitches in the phase error signal.

In still yet another embodiment, the present invention is a method for removing glitches in a phase error signal including generating a multi-phase signal, rotating the multi-phase signal by one of a plurality of phase rotations, and counting a number of glitches in a phase error signal for a predetermined period of time for each of the plurality of phase rotations.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

FIG. 9 is a glitch correction unit according to an embodiment of the present invention; and FIG. 10 is a graph stored in a lookup table according to an embodiment of the present invention;

FIG. 11 is a process for removing glitches according to an embodiment of the present invention;

FIG. 12 depicts an operation of a glitch correction unit according to an embodiment of the present invention;

FIG. 22 is a fractional phase lookup table;

DETAILED DESCRIPTION OF THE PREFERRED EMBODIMENTS

Reference will now be made in detail to the preferred embodiments of the invention which set forth the best modes contemplated to carry out the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, molding procedures have not been described in detail as not to unnecessarily obscure aspects of the present invention.

Figure 1:
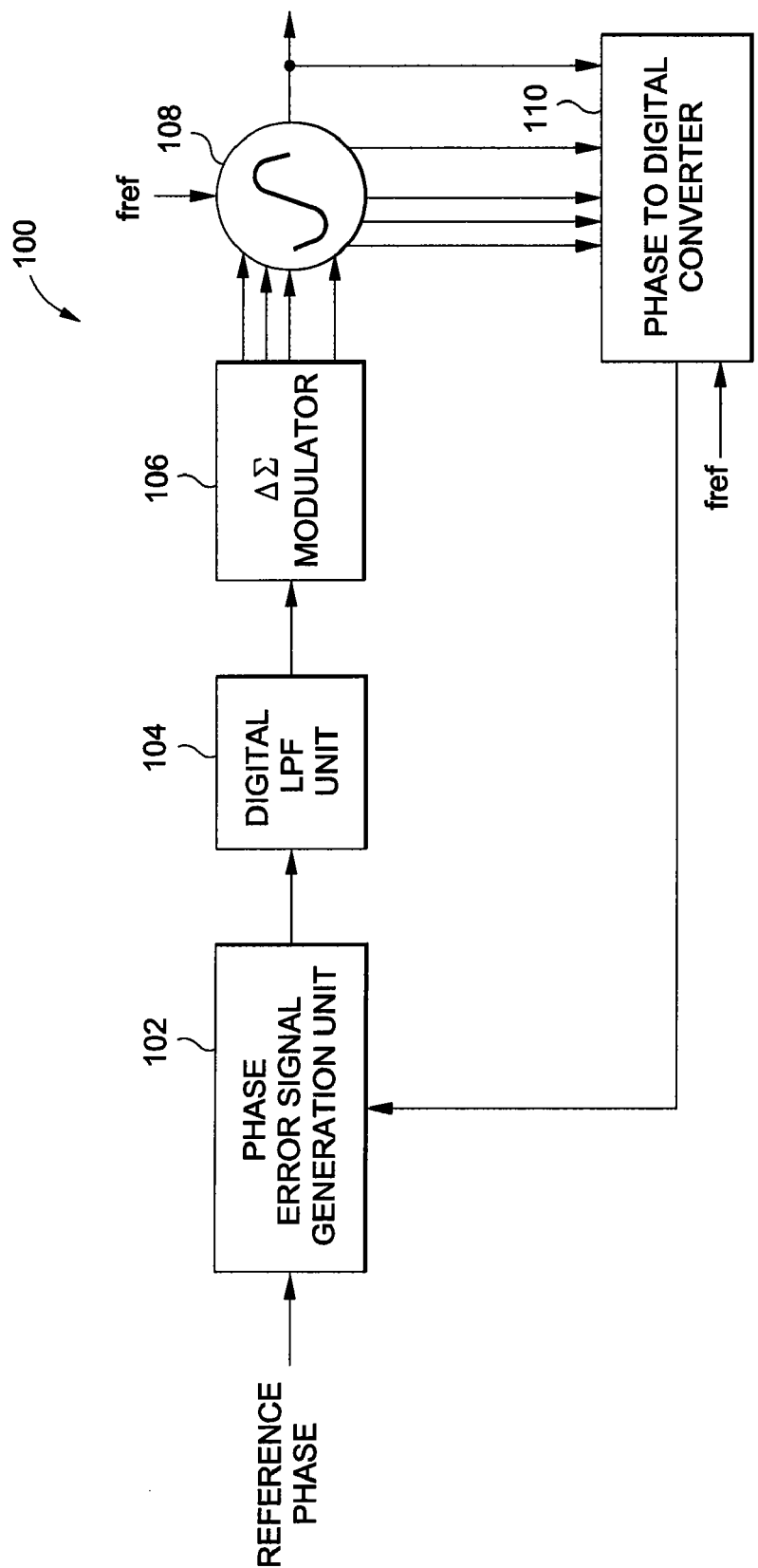
FIG. 1 is a box diagram of an all digital phase lock loop.

A phase lock loop 100 is shown in FIG. 1. The phase lock loop can be, for example, an all digital phase lock loop. As can be seen, the phase lock loop 100 can include, for example, a phase error signal generation unit 102, a digital low pass filter unit 104, a ΔΣ modulator 106, a multi-phase oscillator 108, and/or a phase to digital converter 110. The phase error signal generation unit 102 can be connected, for example, to the digital low pass filter unit 104. The phase error signal generation unit 102 can receive, for example, a phase signal from a phase to digital converter 110 and a reference phase signal. The phase error signal generation unit 102 determines a difference between the reference phase signal and the phase signal to generate a phase error signal.

The digital low pass filter unit 104 is connected, for example, to the phase error signal generation unit 102 and/or the ΔΣ modulator 106. The digital low pass filter unit 104 can, for example, receive and filter out high frequencies in the phase error signal to generate a filtered phase error signal. The removal of the high frequencies can increase, for example, a stability of the phase lock loop due to its feedback nature. The ΔΣ modulator 106 is connected, for example, to the digital low pass filter unit 104 and/or the multi-phase oscillator 108. The ΔΣ modulator 106 can receive and perform a noise shaping function on the filtered phase error signal. The filtered phase error signal is then transmitted to the multi-phase oscillator 108.

The multi-phase oscillator 108 is connected, for example, to the ΔΣ modulator 106 and/or the phase to digital converter 110. The multi-phase oscillator 108 can receive, for example, the filtered phase error signal and generate a multi-phase signal. The multi-phase oscillator 108 can also receive the reference clock signal fref to clock the operations of the multi-phase oscillator. The multi-phase signals can be used, for example, to generate fractional signals and/or integer signals.

The phase to digital converter 110 is connected to the multi-phase oscillator 108 and/or the phase error signal generation unit 102. The phase to digital converter 110 receives the multi-phase signals and generates a phase signal including a fractional phase signal and an integer phase signal. The fractional phase signal can correspond to the fractional phase of the phase rotation for the multi-phase oscillator 108 and an integer phase signal can correspond to the integer phase of the phase rotation for the multi-phase oscillator 108. The phase to digital converter 110 can also receive the reference clock signal fref to clock the operations of the phase to digital converter 110.

Figure 2:
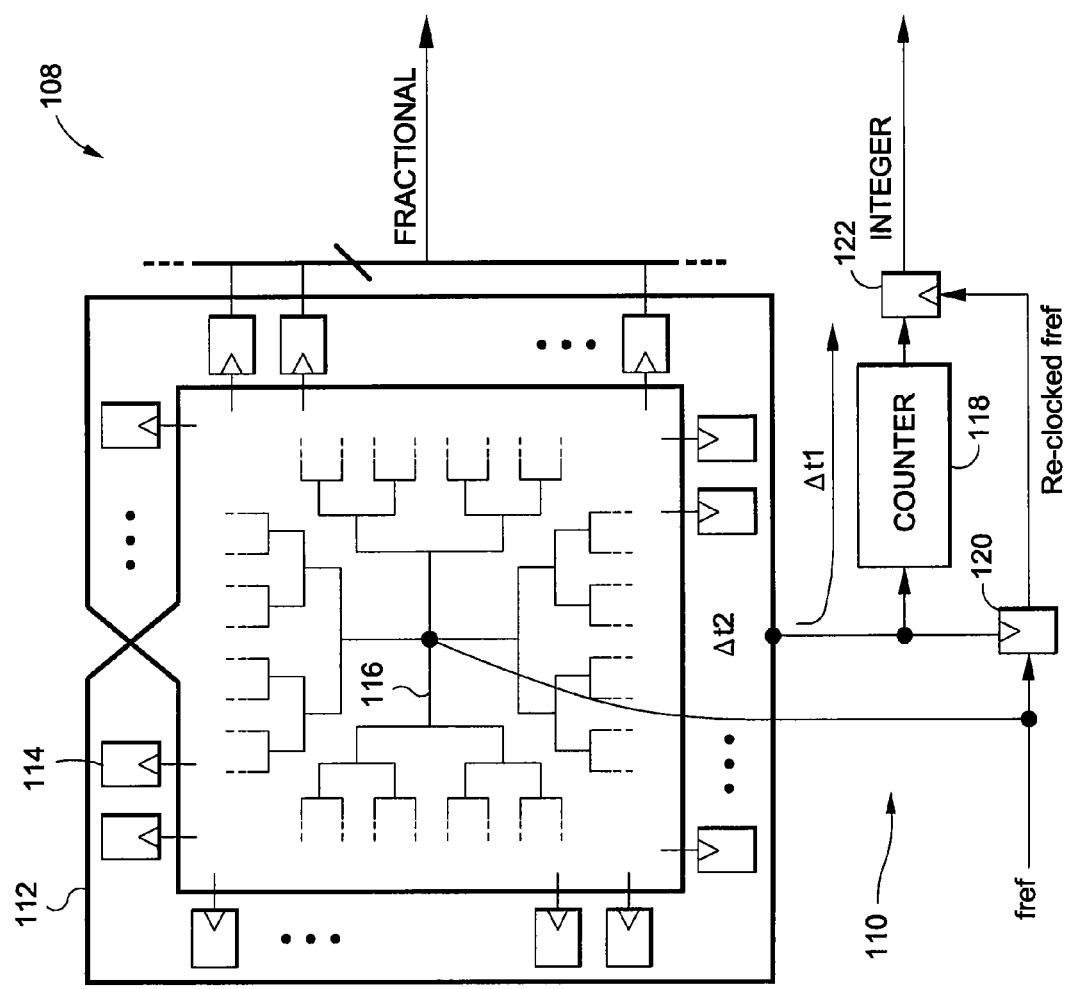
FIG. 2 is a schematic diagram of a multi-phase oscillator and portions of a phase to digital converter.

The multi-phase oscillator 108 and portions of the phase to digital converter 110 can be seen, for example, in FIG. 2. In FIG. 2, multi-phase oscillator 108 includes a closed-loop transmission line 112. A plurality of latches 114 are connected to the closed-loop transmission line 112. A main circuit 116 supplies the reference clock signal fref to the latches 114. The reference signal fref clocks the latches 114. The latches 114 output multi-phase signals when clocked by the reference signal.

The latch 120, the counter 118 and/or the latch 122 can be part of the phase to digital converter 110. The latch 120 is clocked by a non-latched output from the multi-phase oscillator 108 which was received by the counter 118. The latch 120 functions as a re-clocking block and re-clocks the reference clock signal fref. Thus, the latch 120 transmits a re-clocked fref to latches 122. The counter 118 receives the non-latched output from the multi-phase oscillator 108 and outputs the result to the latch 122. The latch 122 is clocked by the re-clocked fref from the latch 120 and outputs the integer signal. Although only a single latch 122 is depicted in FIG. 2, the latch 122 can represent, for example, multiple latches as will be described later.

However, the fractional signal and the integer signal are on two separate paths. It takes a time period of Δt2 for the fractional signal to be output once the multi-phase oscillator 108 is clocked by the reference clock signal fref, while it takes a time period of Δt1 for the integer signal to be output once the phase to digital converter 110 is clocked by the reference clock signal fref. Due to the different components within the two separate paths, which have different delays, and also the high speed of the multi-phase oscillator, Δt1 may not equal Δt2. This can introduce glitches to the phase signal output from the phase to digital converter 110 (FIG. 1), which is calculated using the fractional signal and the integer signal. Errors in the phase signal can be propagated to the phase error signal output from the phase error signal generation unit 102.

Figure 4:
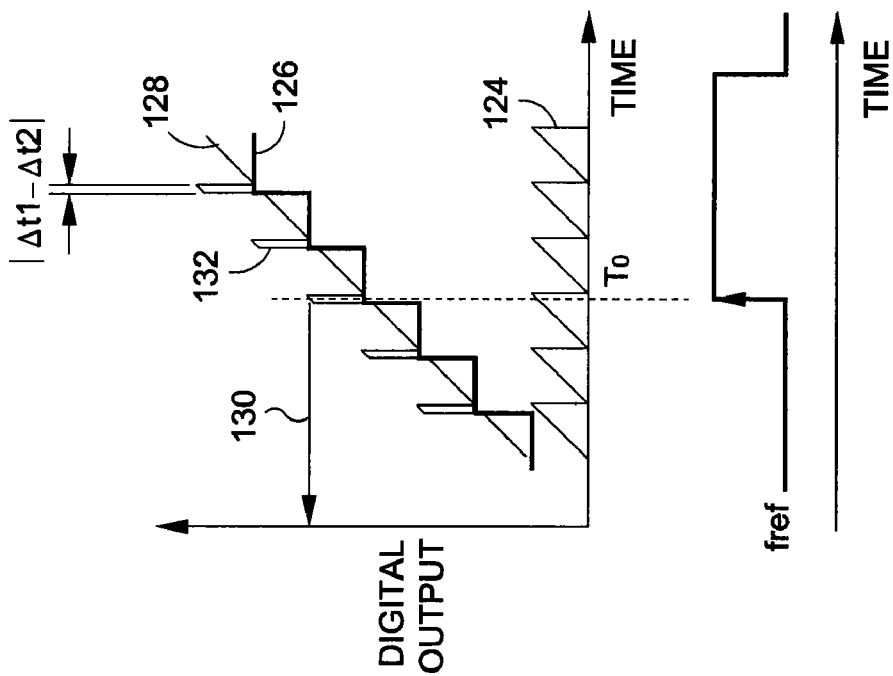
FIG. 4 is a graph indicating a phase signal with glitches.
Figure 3:
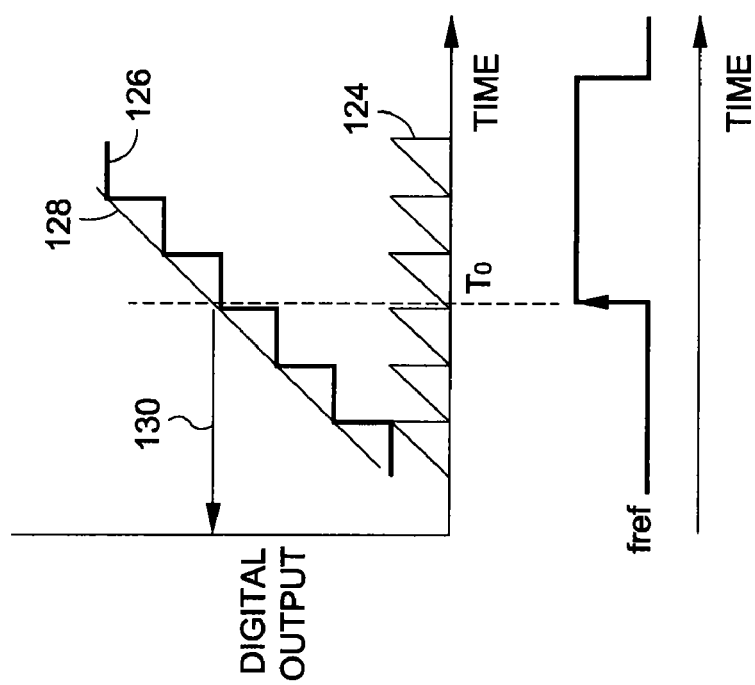
FIG. 3 is a graph indicating a phase signal without glitches.

These errors are evident by comparing the graph in FIG. 3 and the graph in FIG. 4. In an optimal phase lock loop, the fractional phase signal output from the phase to digital converter 110, as represented by line 124, is summed with the integer phase signal output from the phase to digital converter 110, as represented by line 126 as shown in FIG. 3. The sum is the phase signal output from the phase to digital converter 110 as represented by line 128. The line 124 increases until it reaches 2π and then resets to 0. This cyclical representation corresponds to the wave traveling around the multi-phase oscillator 108 and the fact that it has traveled 360° every 2π radians. Every time the fractional phase signal resets to 0, the line 126 increments by 2π radians to signify the fact that the wave traveled 360° in the multi-phase oscillator 108. Thus, the line 128, which represents the sum of the fractional phase signal and the integer phase signal is an accurate representation of the amount of travel by the wave around the multi-phase oscillator 108. For example, at time $T_0$, the line 124 has already reset, and the line 126 has already been incremented, providing the line 128 an accurate value of the travel of the wave in the multi-phase oscillator indicated by the line 130. At time $T_0$, a glitch-free phase signal will be used.

However, due to the mismatch in the time period Δt1 and the time period Δt2, glitches can occur as seen in FIG. 4. For example, in FIG. 4, the time period Δt1 is less than the time period Δt2. Thus, the line 126 corresponding to the integer phase signal can be incremented prior to the line 124 resetting to 0, even though both should occur substantially simultaneously. This can result, for example, in glitches such as the glitch 132. As can be seen, the glitch 132 is similar to an abnormal spike in value. This is because, for example, at time $T_0$, the line 126 has already been incremented, but the line 124 has not reset to 0, yet. Thus, the line 126 has already accounted for the completion of 360° of travel by the wave around the multi-phase oscillator, but the line 124 indicates that the wave has not completed 360° of travel around the multi-phase oscillator, yet. This essentially counts a portion of the wave's travel around the multi-phase oscillator twice. Thus, the line 130 is higher in FIG. 4 than in FIG. 3. In FIG. 4, the line 130 does not represent the accurate value, but instead represents an inaccurate value since part of the travels of the wave along the multi-phase oscillator is essentially counted twice due to the difference in the time period Δt1 and the time period Δt2.

Figure 5:
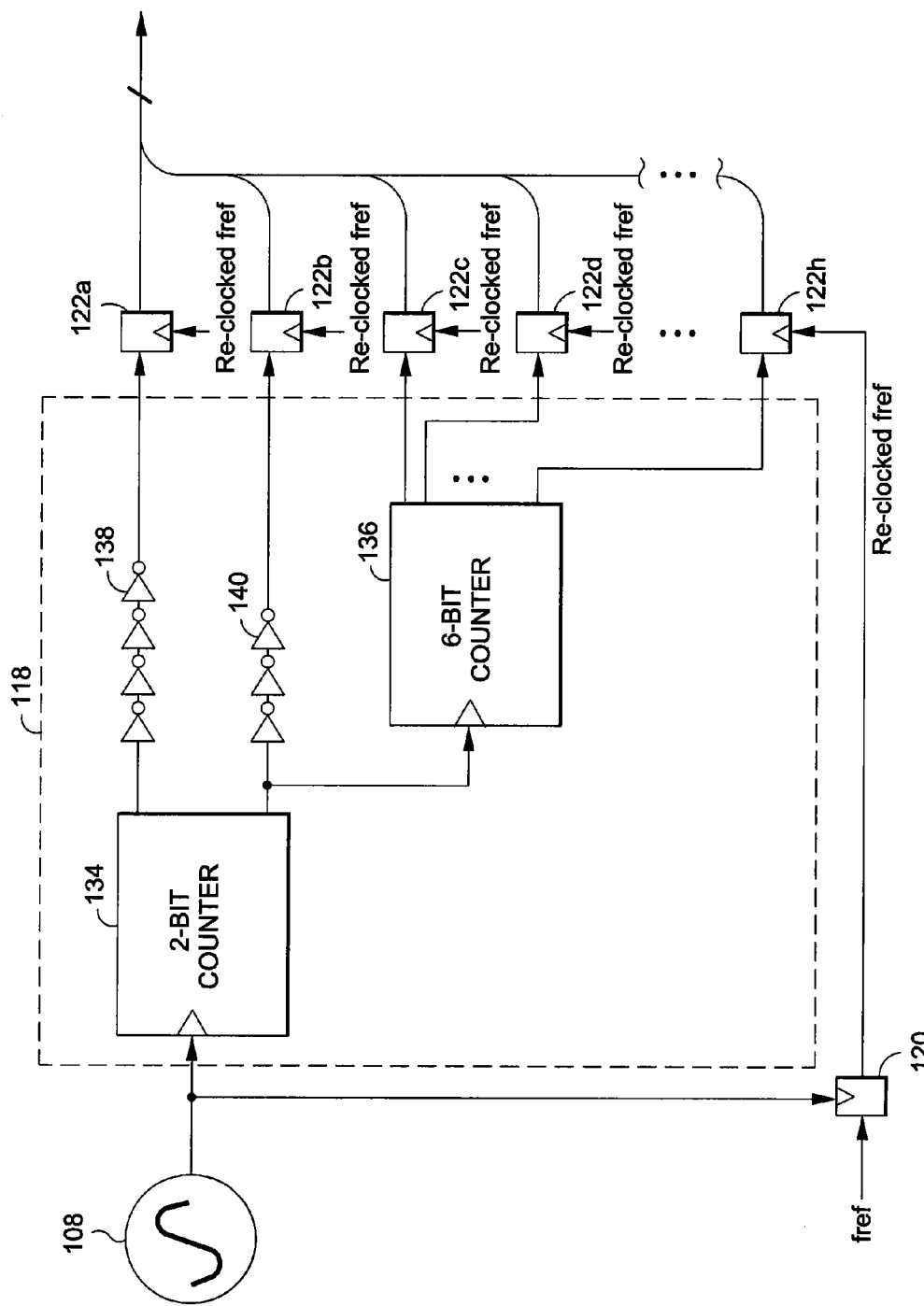
FIG. 5 depicts a digital counter.

Further delay problems can also be encountered, for example, in the counter 118 as shown in FIG. 5. As can be seen in FIG. 5, the counter 118 includes a 2-bit counter 134 connected to the 6-bit counter 136. The 2-bit counter 134 is also connected, for example, to the latches 122a and/or the latches 122b while the 6-bit counter 136 is also connected, for example, to the latch 122c. Delays 138 are located between the 2-bit counter 134 and the latch 122a, while delays 140 are located between the 2-bit counter 134 and the latch 122b. As can be seen, delays 138 include 4 delays while delays 140 include 3 delays.

In addition, 6-bit counter 136 is directly connected to the latches 122c, 122d, 122e, 122f, 122g, and/or 122h. Thus, the path between the 2-bit counter 134 and the latch 122a, the path between the 2-bit counter 134 and the latch 122b, and the path between the 6-bit counter 136 and the latches 122c-h can have varying delay times. This can result, for example, in glitches which can be seen in FIG. 6 and FIG. 7.

Figure 7:
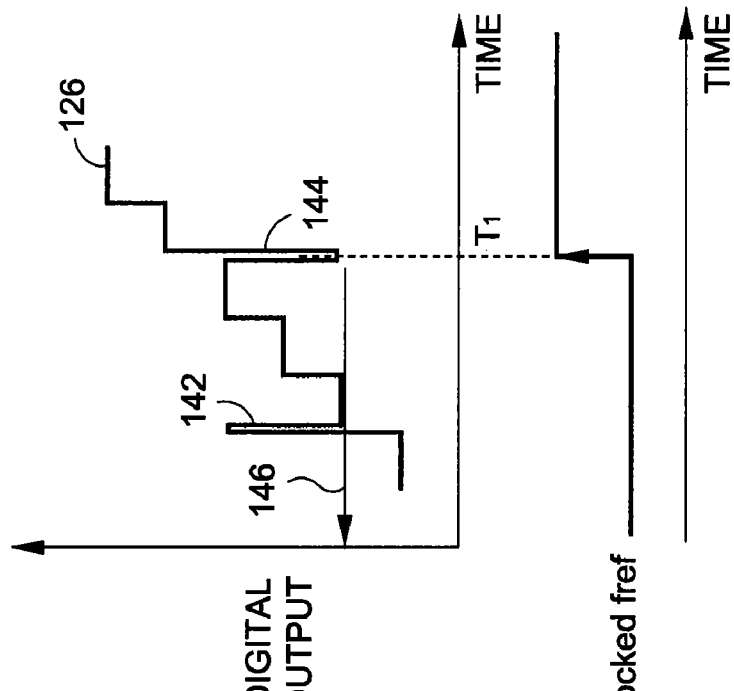
FIG. 7 is a graph indicating an integer signal from a digital counter with glitches.
Figure 6:
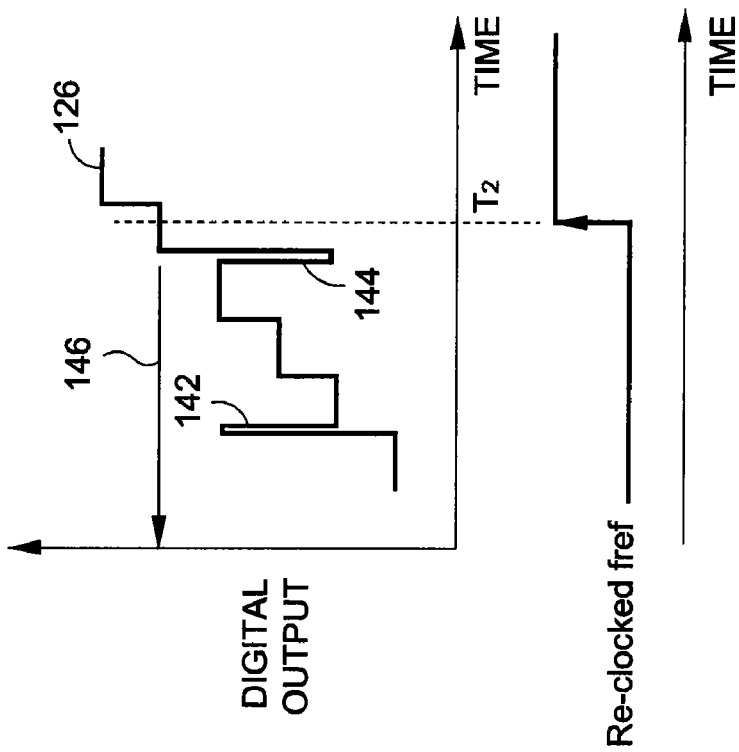
FIG. 6 is a graph indicating an integer signal from a digital counter with glitches.

FIG. 6 and FIG. 7 depict the values corresponding to the integer phase signal as shown in the line 126. As can be seen in FIG. 6, glitches 142 and 144 can occur due to the varied delay times between the different paths in the counter 118. At time T2, such glitches are not a problem, because the value of the line 126 does not include the glitches 142 or 144. Thus, the line 146 represents an accurate value of the integer phase signal. However, as seen in FIG. 7, at time T1, the line 146 does not represent the accurate value of the integer phase signal since the line 126 includes the glitch 144.

Figure 8:
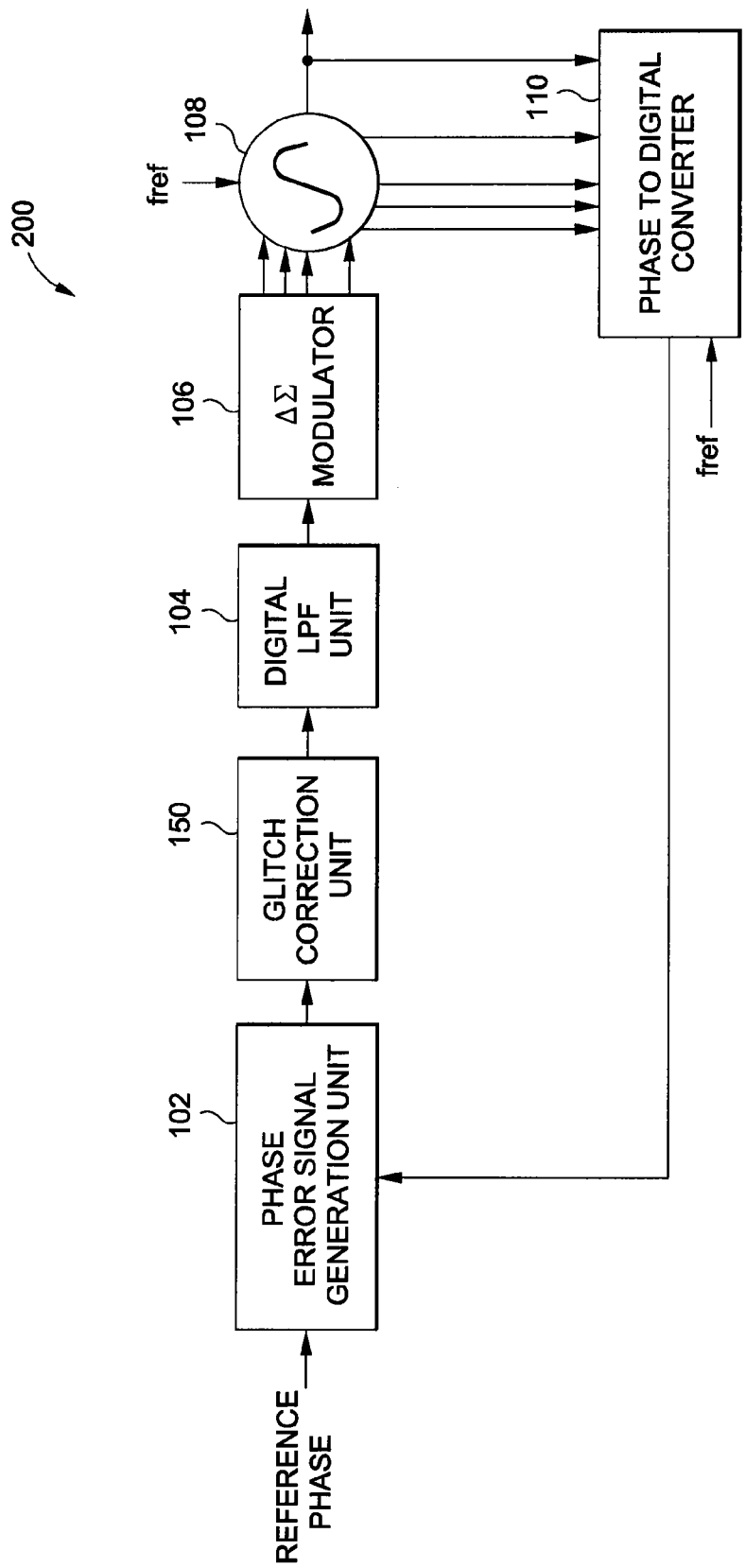
FIG. 8 is a phase lock loop including a glitch correction unit according to an embodiment of the present invention.

To correct the glitches, in one embodiment, the present invention is a phase lock loop 200 as seen in FIG. 8. The phase lock loop 200 is similar to the phase lock loop 100 except that the phase lock loop 200 includes a glitch correction unit 150 connected between the phase error signal generation unit 102 and the digital low pass filter unit 104. The glitch correction unit 150 receives, for example, a phase error signal from the phase error signal generation unit 102, and substantially corrects the phase error signal by substantially removing any glitches in the phase error signal. The corrected phase error signal is then transmitted to the digital low pass filter unit 104.

FIG. 9 depicts the glitch correction unit 150 according to an embodiment of the present invention. As can be seen, the glitch correction unit 150 includes, for example, an input 152, an on switch 154, a subtraction unit 156, a subtraction unit 158, a lookup table 160, a unit delay module 162, a switch 164, and/or an output 166. The on switch 154 is connected to the switch 164 and determines, whether the glitch correction unit 150 is active or inactive. The input 152 is connected to the subtraction unit 156, the subtraction 158, and/or the switch 164. The input 152 receives, for example, a phase error data of a phase error signal from the phase error signal generation unit 102. (FIG. 8)

The switch 164 is connected, for example, to the subtraction unit 158 and/or the input 152. The switch 164 either outputs the original phase error data of the phase error signal from the input 152 or the corrected phase error data from the subtraction unit 158. The stream of the corrected phase error data forms the corrected phase error signal. When the glitch correction unit 150 is active, as determined by the on switch 164, the glitch correction unit outputs the corrected phase error data from the subtraction unit 158. However, when the glitch correction unit 150 is inactive, as determined by the on switch 164, the glitch correction unit passes through the original phase error data from the input 152.

The switch 164 outputs either the original phase error data or the corrected phase error data to the output 166 and/or the unit delay module 162. Thus either the original phase error signal or the corrected phase error signal is outputted by the output 166. The output 166, for example, transmits either the original phase error signal or the corrected phase error signal to the digital low pass filter unit 104 (FIG. 8) depending on whether the glitch correction unit is active or inactive according to the on switch 154.

The unit delay module 162 receives either the original phase error data or the corrected phase error data and delays the original phase error data or the corrected phase error data by one unit of time and passes the result to the subtraction unit 156. This allows for the comparison of consecutive phase error data. Generally when the glitch correction unit 150 is active, the unit delay module 162 will receive the corrected phase error data aside from an initial transition step right when the glitch correction unit 150 is switched to being active.

The subtraction unit 156 receives a second phase error data at a next unit of time. Thus, the second phase error data is the next consecutive phase error data of the original phase error data. The subtraction unit 156 takes the difference between the original phase error data and the second phase error data, or the original phase error data and the corrected phase error data and passes the result to the lookup table 160. The look up table determines the subtraction value based on a subtraction value graph as shown in FIG. 10.

The subtraction value is, for example, an error value which should be subtracted from a phase error data in order to remove the glitches. As seen in FIG. 10, the values $2\pi-\Delta q$, $4\pi-\Delta q$, $-2\pi+\Delta q$, and/or $-4\pi+\Delta q$ can represent predetermined phase error value thresholds. If the difference between the original phase error data and the second phase error data is less than, for example, $2\pi+\Delta q$, and greater than, for example, $-2\pi+\Delta q$ then the subtraction value is 0, since no compensation is required for the second phase error data. Otherwise, the subtraction value is $2\pi$ if the difference between the original phase error data and the second phase error data is greater than $2\pi-\Delta q$ and less than $4\pi-\Delta q$, or $-2\pi$ if the difference between the original phase error data and the second phase error data is less than $-2\pi+\Delta q$ and greater than $-4\pi+\Delta q$.

The $\Delta q$ can be, for example, a small value, such as a value less than 0.5 radians. The predetermined threshold, such as $2\pi-\Delta q$ can be selected to be larger than a difference between two consecutive phase error data under normal operating conditions of the phase lock loop 200. This is because consecutive phase error data may not have identical values under normal operations and if the $2\pi-\Delta q$ is smaller than the difference between two consecutive phase error data under normal operating conditions of the phase lock loop, a false positive may be detected and the wrong subtraction value may be determined.

The subtraction value is outputted to the subtraction unit 158 where the difference is taken between the subtraction value and the second phase error data to generate the corrected second phase error data. The switch 164 then determines whether to output either the original second phase error data or the corrected second phase error data. The original second phase error data or the corrected second phase error data along with the original phase error data or the corrected phase error data can be part of the corrected phase error signal and/or a phase error signal with the glitches removed. Generally, however, once the on switch 154 indicates that the glitch correction unit 150 should be active, and aside from the initial output of the output 166, the corrected phase error signal will only include corrected phase error data instead of the original phase error data.

Although FIG. 9 depicts the use of the lookup table 160, the lookup table 160 can be replaced by an equivalent arithmetic estimator. The equivalent arithmetic estimator can determine the subtraction value.

The operation of the glitch correction unit 150 and of the present invention can also be seen, for example, in FIG. 11 and FIG. 12 with reference also to FIG. 9. In FIG. 11, in Step S1102, the process waits until the loop settles. For example, since the phase lock loop 200 (FIG. 8) locks onto the reference phase signal using a feedback loop, the glitch correction unit 150 (FIG. 12) is inactive until the phase lock loop 200 substantially locks onto the reference phase. Thus, the on switch 154 indicates that the glitch correction unit 150 is inactive and that the switch 164 should output the original phase error data without correction.

In Step S1104, the glitch correction unit is turned on. For example, the glitch correction unit 150 is activated by the on switch 154 once the phase lock loop has substantially locked onto the reference phase signal. In Step S1106, a difference is computed between two consecutive phase errors. For example, the glitch correction unit 150 can receive the phase error signal 168 including glitches 170 as seen in FIG. 12. The glitch correction unit 150 can calculate the difference between two consecutive phase error data ($\Delta p$) in the phase error signal 168 to determine the differences 176 which are greater than a predetermined phase error value threshold. More specifically, as seen in FIG. 9, the subtraction unit 156 determines the difference between two consecutive phase error data.

In Step S1108 if $\Delta p$ is greater than $+2\pi \times i-\Delta q$ ($i=1, 2, \ldots$) then $2\pi \times i$ is subtracted from $\Delta p$, but if $\Delta p$ is less than $-2\pi \times i+\Delta q$ ($i=1, 2, \ldots$) then $2\pi \times i$ is added to $\Delta p$. For example, as seen in FIG. 12, the glitch correction unit 150 removes glitches 170 by subtracting or adding $2\pi$ to generate a corrected phase error signal 168 without glitches. More specifically as seen in FIG. 9, the lookup table 160 can be used to determine the subtraction value. The subtraction value is then subtracted from the latter of the consecutive phase error data by the subtraction unit 158. The corrected phase error signal is outputted by the switch 164 and the output 166.

Figure 14:
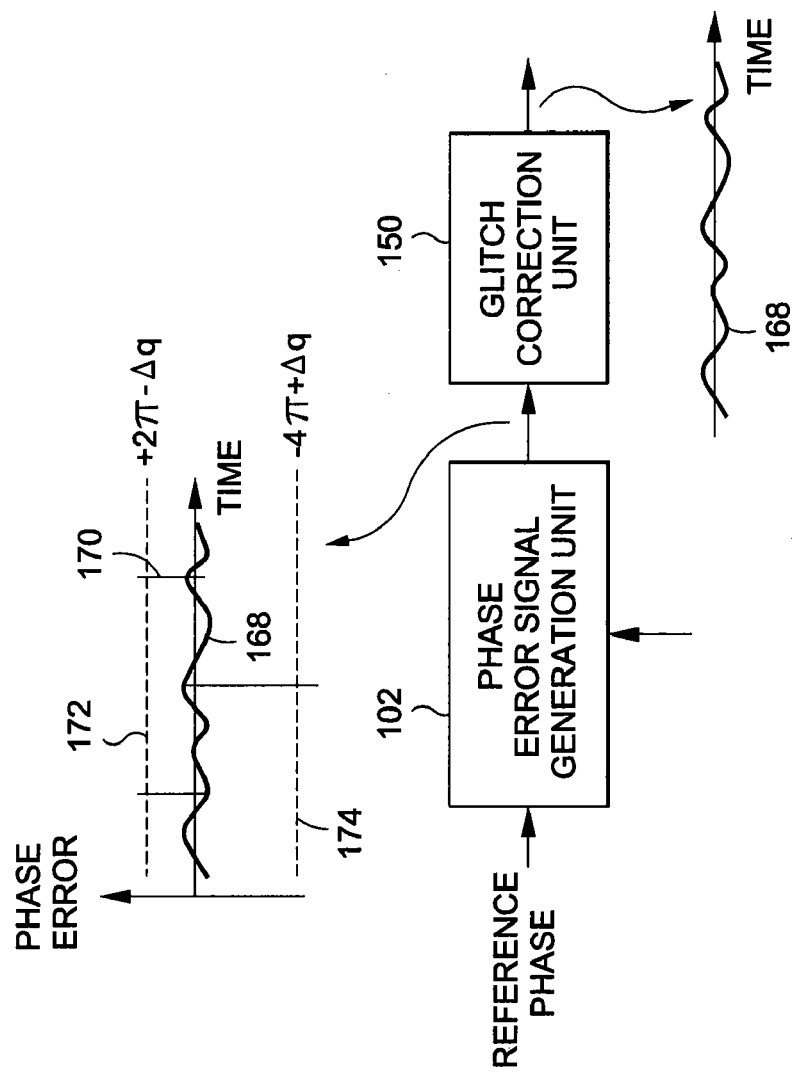
FIG. 14 depicts an operation of a glitch correction unit according to an embodiment of the present invention.
Figure 13:
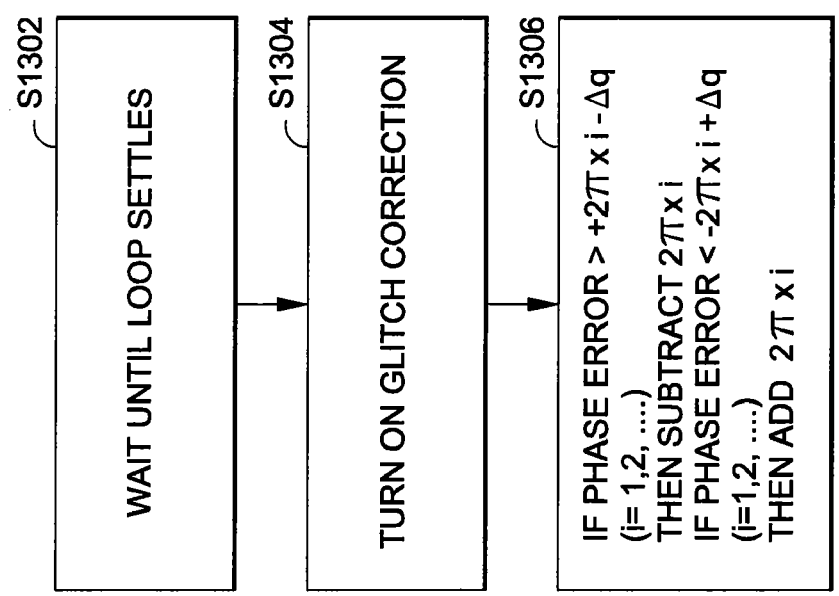
FIG. 13 is a process for removing glitches according to an embodiment of the present invention.

In another embodiment, the operation of the glitch correction unit 150 and of the present invention can also be seen, for example, in FIG. 13 and FIG. 14. In Step S1302, the process waits until the loop settles. For example, since the phase lock loop 200 (FIG. 8) locks onto the reference phase signal using a feedback loop, the glitch correction unit 150 (FIG. 14) is inactive until the phase lock loop 200 substantially locks onto the reference phase.

In Step S1304, the glitch correction is turned on. For example, the glitch correction unit 150 is activated. In Step S1306, if the phase error data is greater than $+2\pi \times i-\Delta q$ ($i=1, 2, \ldots$) then $2\pi \times i$ is subtracted from the phase error data, but if the phase error data is less than $-2\pi \times i+\Delta q$ ($i=1, 2, \ldots$) then $2\pi \times i$ is added to the phase error data. Thus, instead of comparing the difference between consecutive phase error data, an analysis is performed on a single phase error data to determine if the value of the phase error data exceeds predetermined error difference thresholds 170 and 172. If the value of the phase error exceeds the predetermined error difference thresholds 170 and 172, a predetermined error value is subtracted or added to the single phase error data. This can be seen, for example, in FIG. 14 where the glitch correction unit directly removes the glitches 170 without analyzing the $\Delta p$.

Figure 16:
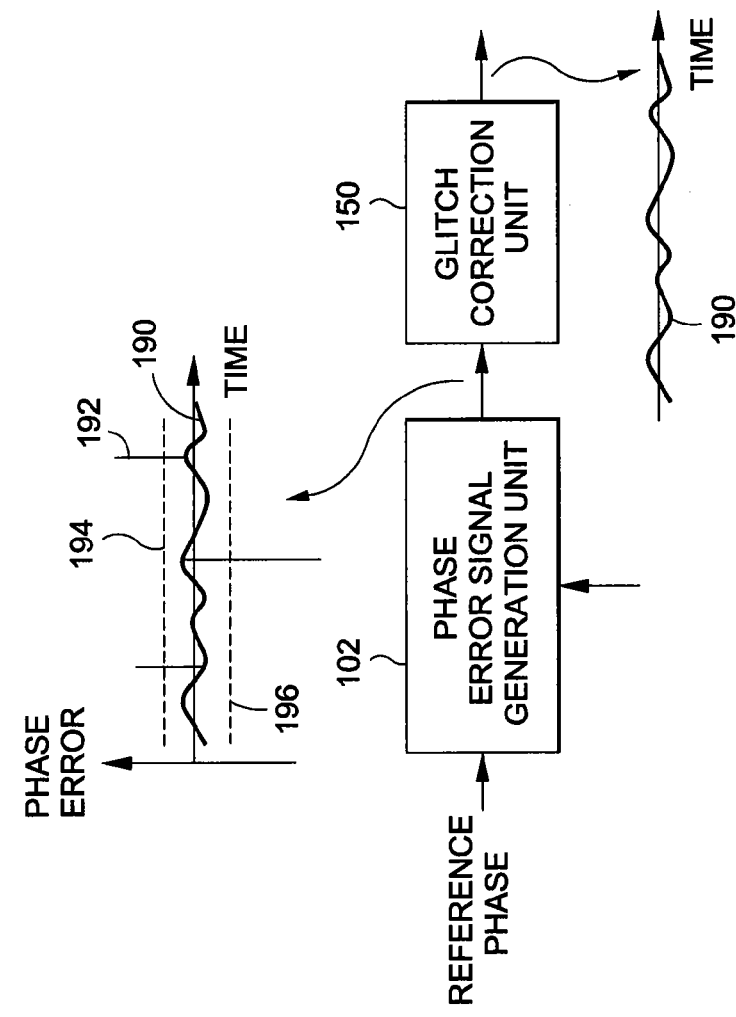
FIG. 16 depicts an operation of a glitch correction unit according to an embodiment of the present invention.
Figure 15:
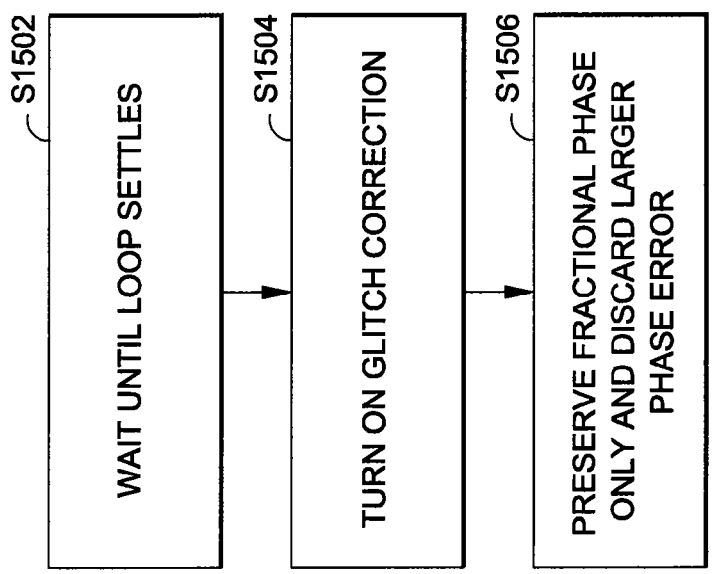
FIG. 15 is a process for removing glitches according to an embodiment of the present invention.

In still another embodiment, the operation of the glitch correction unit 150 and of the present invention can also be seen, for example, in FIG. 15 and FIG. 16. In Step S1502, the process waits until the loop settles. For example, since the phase lock loop 200 (FIG. 8) locks onto the reference phase signal using a feedback loop, the glitch correction unit 150 (FIG. 16) is inactive until the phase lock loop 200 substantially locks onto the reference phase. In Step S1504, the glitch correction is turned on. For example, the glitch correction unit 150 is activated.

In Step S1506, only the fractional phase information is preserved. For example, the phase error signal can be comprised of a fractional phase error signal and an integer phase error signal. The fractional phase error signal is preserved, while the integer phase error signal is discarded. This is because as the loop settles, generally the integer phase error signal is reduced to zero due to the phase lock loop substantially locking onto the reference phase. Any phase error values are likely to be small and can be adequately represented by the fractional phase error signal. Thus, as seen in FIG. 16, the glitch correction unit 150 receives a fractional phase error signal 190 with glitches 192. The glitch correction unit 150 determines whether the fractional phase error data have phase error values that exceed the predetermined phase error value thresholds 194 or 196 as indicated by glitches 192. The glitch correction unit 150 removes the glitches 192 and the corrected fractional phase error signal 190 without glitches is output.

In one embodiment, the configuration and hardware of the glitch correction unit 150 can be adapted to accommodate the processes depicted in FIG. 13, and FIG. 15. In addition, the configuration and hardware for the glitch correction unit 150 is not limited to just the configuration and hardware depicted in FIG. 9 for the process shown in FIG. 11, but can be varied and adjusted as necessary to remove the glitches in the phase error signal.

Figure 17:
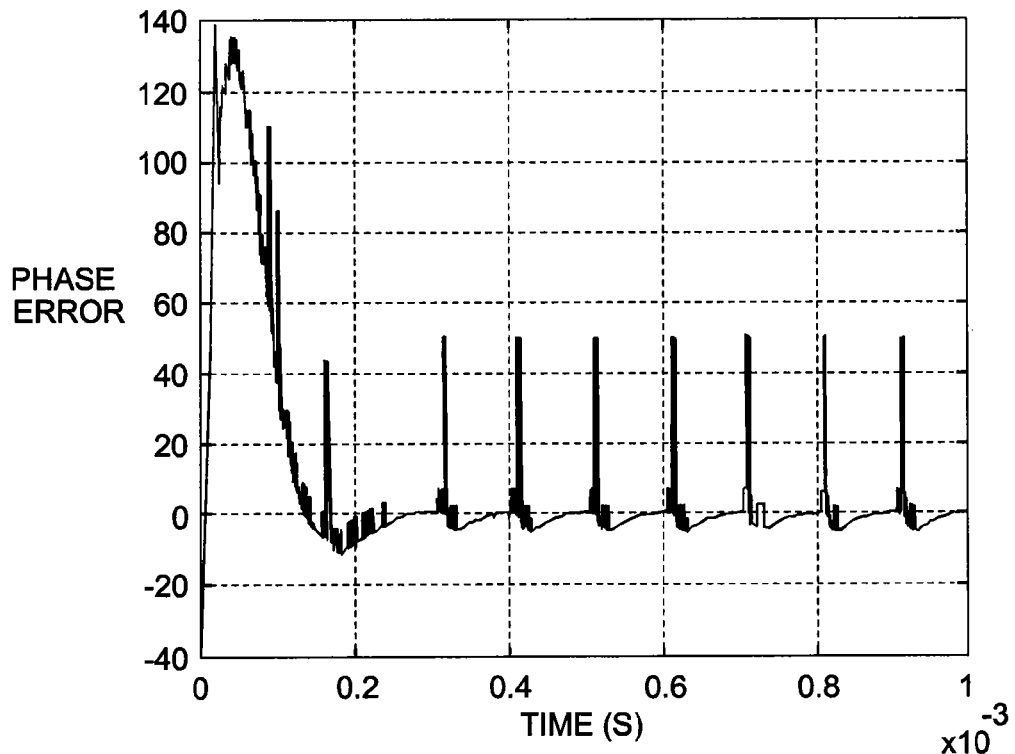
FIG. 17 is a graph of a PD output with glitches.
Figure 18:
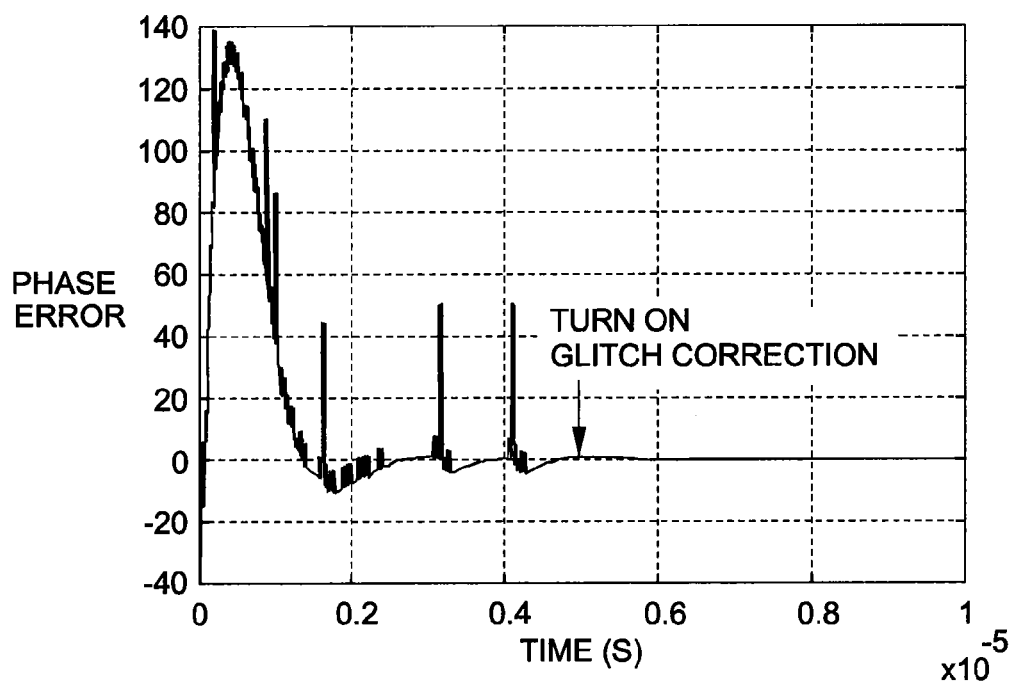
FIG. 18 is a graph of a PD output with glitches corrected according to an embodiment of the present invention.

The benefits of the phase lock loop 200 and/or the glitch correction unit 150 of the present invention can be seen, for example, through a comparison of FIG. 17 and FIG. 18. FIG. 17 depicts, for example, values of the phase error signal without activating the glitch correction unit 150. As can be seen, glitches occur periodically in the phase error signal. FIG. 18 depicts, for example, the phase error signal when the glitch correction unit 150 activated. As can be seen, after the activation of the glitch correction unit 150, the glitches in the phase error signal are removed and the corrected phase error signal has substantially no glitches.

Figure 19:
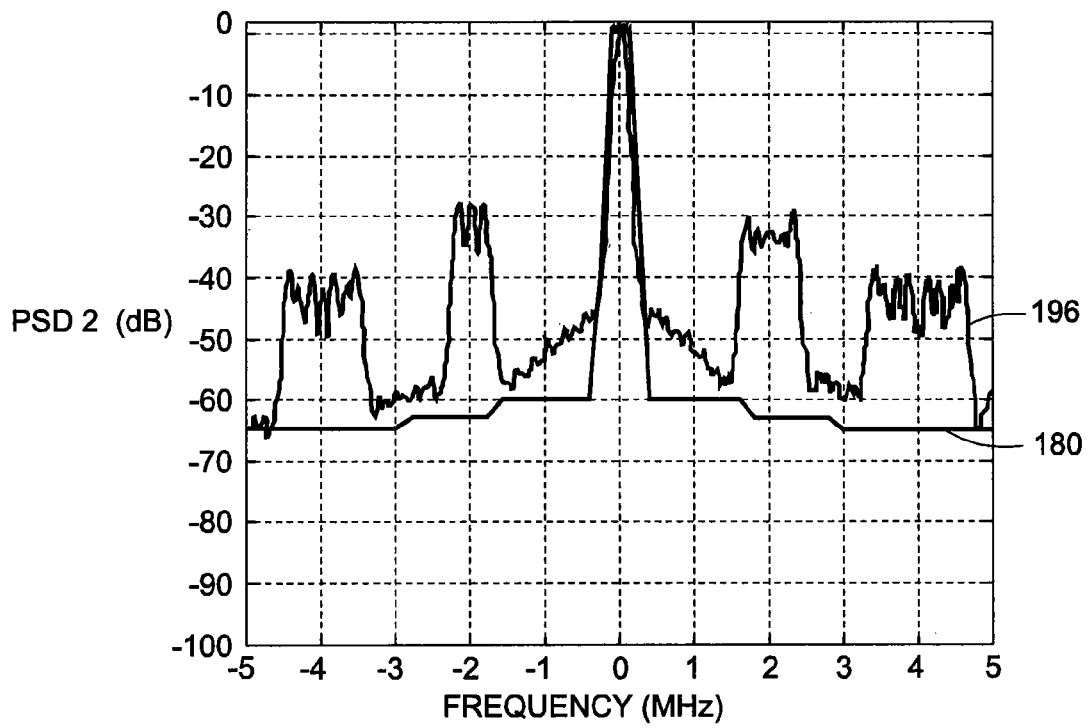
FIG. 19 is a graph of a power spectral density with glitches.
Figure 20:
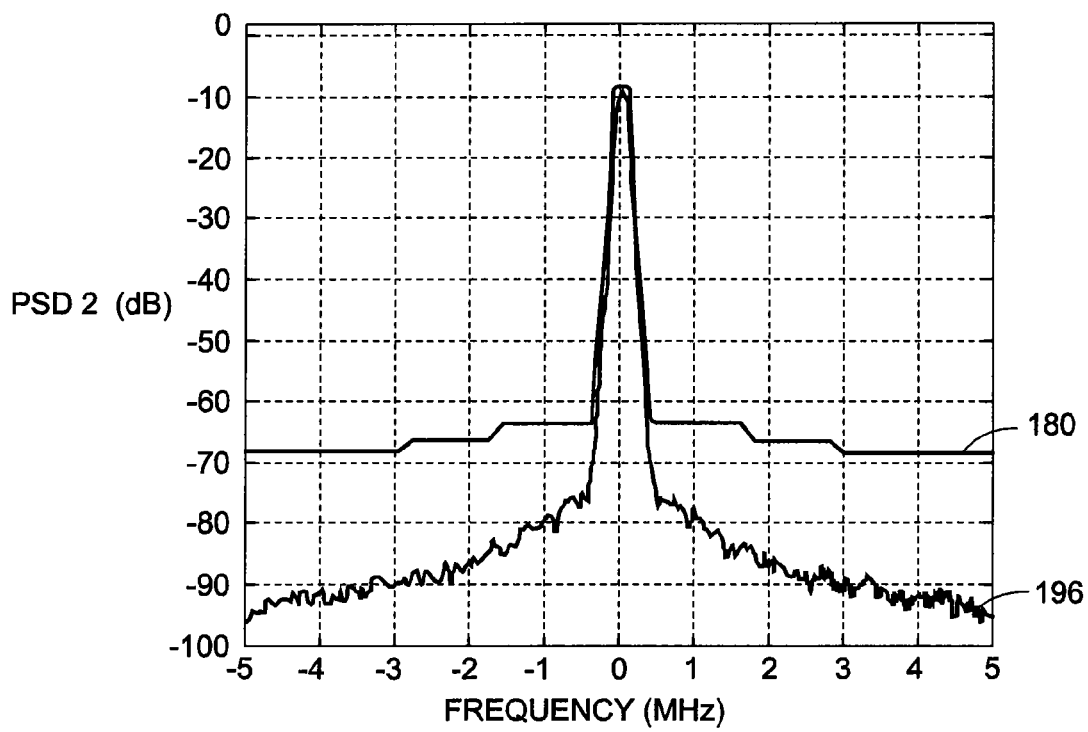
FIG. 20 is a graph of a power spectral density with glitches corrected according to an embodiment of the present invention.

Further benefits can be seen in a comparison of the power spectral density ("PSD") graphs shown in FIG. 19 and FIG. 20. FIG. 19 depicts the phase lock loop without a glitch correction unit such as glitch correction unit 150 present, or with a phase lock loop with a glitch correction unit such as glitch correction unit 150 that is inactive. As can be seen, due to the glitches, the PSD curve 196 for the phase lock loop is undesirably above the specification curve 180 at many different portions of the PSD curve 196. The specification curve 180 can correspond, for example, to a 3rd Generation Partnership Project ("3GPP") specification.

In contrast, FIG. 20 depicts the phase lock loop 200 with a glitch correction unit such as the glitch correction unit 150 active. As can be seen in FIG. 20, the PSD curve 196 for the phase lock loop is desirably below the specification curve 180. This is beneficial as the ability to maintain the operation of the phase lock loop within specifications such as the 3GPP specification can increase the commercial viability of the phase lock loop.

Figure 21:
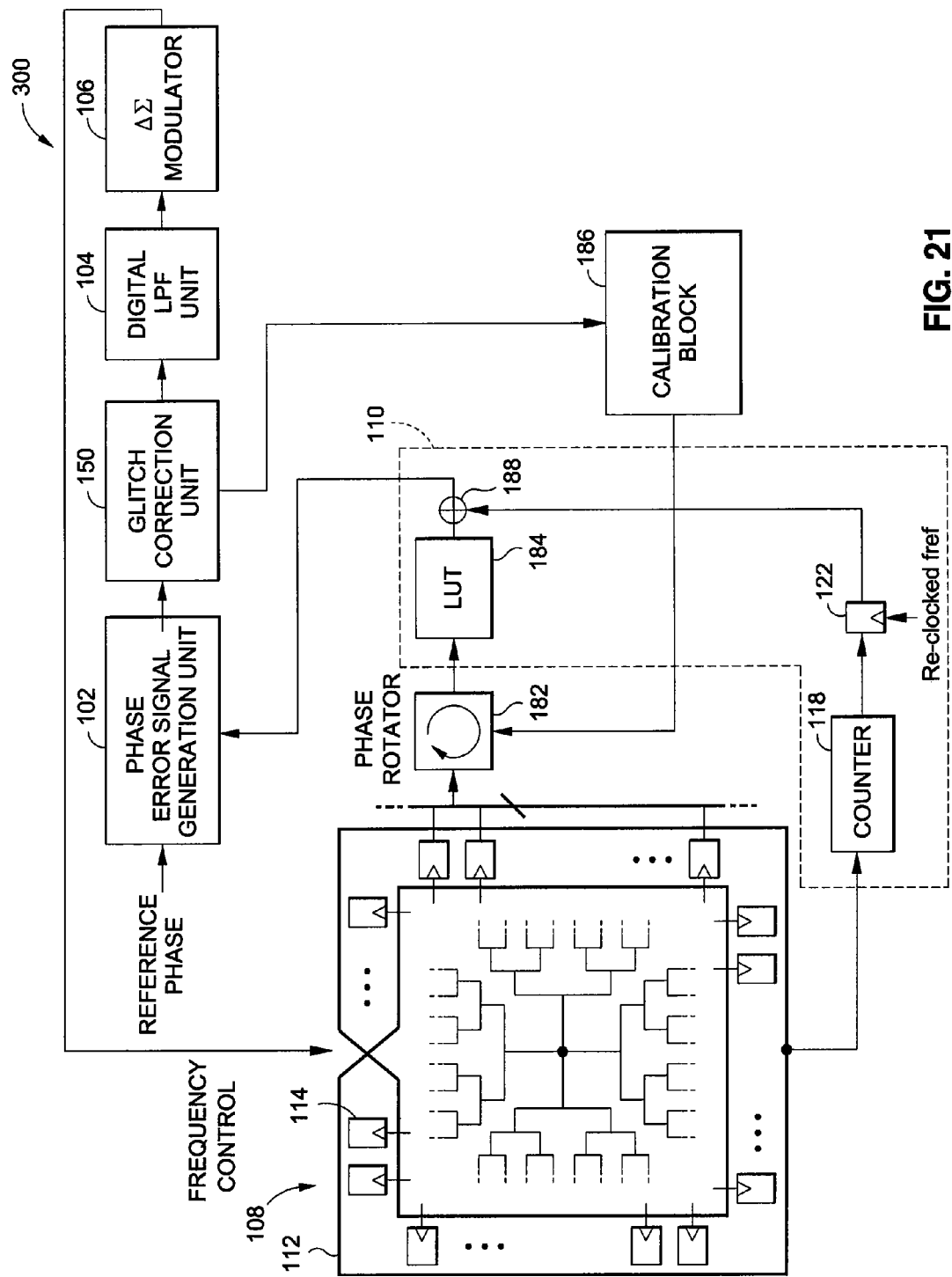
FIG. 21 is a phase lock loop including a phase rotator and a calibration block according to an embodiment of the present invention.

In another embodiment, the present invention can include, for example, a phase lock loop 300 as shown in FIG. 21. The phase lock loop 300 differs from the phase lock loop 200 in the inclusion of the phase rotator 182 and/or the calibration block 186. In FIG. 21, the phase to digital converter can also include a lookup table 184 and a combiner 188 in addition to the counter 118 and the latch 122. Although a single latch is shown in latch 122, it is understood that the latch 122 can represent a plurality of latches.

The lookup table 184 can be seen, for example, in FIG. 22. Based on the output of the latches 114 (indicated as TAP in FIG. 22) in the multi-phase oscillator 108 when clocked by the reference clock signal fref, the phase in degrees can be determined. For example, an output of P1=1, P2=0, P3=0, P4=0, P5=0, P6=0, P7=0, and P8=0 results in a fractional phase of approximately 0-22.5 degrees. While an output of P1=1, P2=1, P3=0, P4=0, P5=0, P6=0, P7=0, and P8=0 results in a fractional phase of approximately 22.5-45 degrees.

The phase rotator 182 is connected between the multi-phase oscillator 108 and the lookup table 184. In one embodiment, the phase rotator 182 is connected to the calibration block 186. The phase rotator 182 rotates the multi-phase signal generated by the latches 114 in the multi-phase oscillator 108 by one of a plurality of phase rotations. The rotated multi-phase signal is then converted into a fractional phase signal using the lookup table 184.

Figures 23, 24:
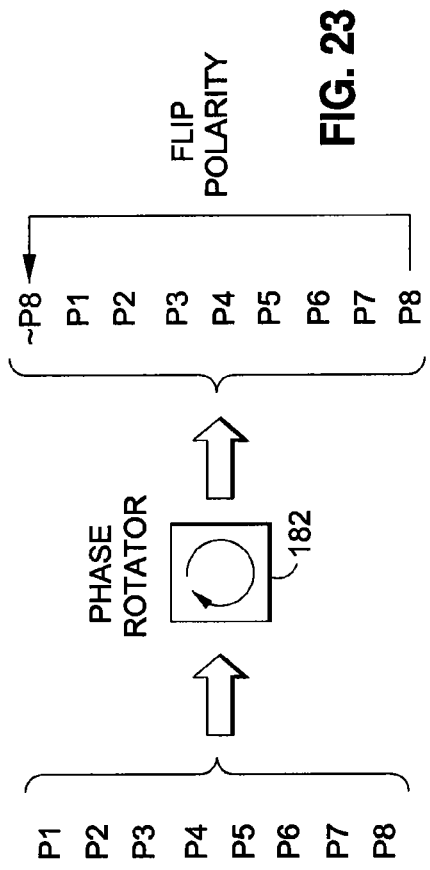
FIG. 23 illustrates an operation of the phase rotator.
FIG. 24 is a fractional phase results table after rotation of the multi-phase signal by a phase rotation.

The operation of the phase rotator can be seen, for example, in FIG. 23. For a single phase rotation, the phase rotator 182 takes the least significant bit, flips the polarity of the least significant bit and pushes the least significant bit with the polarity flipped on top as the most significant bit. For example, in the example of the multi-phase signal with the output P1=1, P2=0, P3=0, P4=0, P5=0, P6=0, P7=0, and P8=0, the rotated multi-phase signal is P1=1, P2=1, P3=0, P4=0, P5=0, P6=0, P7=0, and P8=0. The rotated multi-phase results in a fractional phase signal of approximately 22.5-45 degrees. Likewise, in the example of the multi-phase signal having the output of P1=1, P2=1, P3=0, P4=0, P5=0, P6=0, P7=0, and P8=0, the rotated multi-phase signal has an output of P1=1, P2=1, P3=1, P4=0, P5=0, P6=0, P7=0, and P8=0. The rotated multi-phase signal results in a fractional phase signal of approximately 45-67.5 degrees.

The table in FIG. 24 depicts the effective results of a single phase rotation of the multi-phase signal. As can be seen, the output of the multi-phase signal P1=1, P2=0, P3=0, P4=0, P5=0, P6=0, P7=0, and P8=0 results in a fractional phase of approximately 22.5-45 degrees after a single phase rotation of the multi-phase signal. Likewise, the output of the multi phase signal P1=1, P2=1, P3=0, P4=0, P5=0, P6=0, P7=0, and P8=0 results in a fractional phase of approximately 45-67.5 degrees after a single phase rotation of the multi-phase signal.

Although not shown in FIG. 24, the multi-phase signals can be rotated a plurality of times and not just a single time. For example, with a second phase rotation of the multi-phase signal, the output of the multi-phase signal of P1=1, P2=0, P3=0, P4=0, P5=0, P6=0, P7=0, and P8=0 results in a multi-phase signal output of P1=1, P2=1, P3=1, P4=0, P5=0, P6=0, P7=0, and P8=0 and a fractional phase signal of approximately 45-67.5 degrees. With a second phase rotation of the multi-phase signal, the output of the multi-phase signal of P1=1, P2=1, P3=0, P4=0, P5=0, P6=0, P7=0, and P8=0 results in a multi-phase signal output of P1=1, P2=1, P3=1, P4=1, P5=0, P6=0, P7=0, and P8=0 and a fractional phase signal of approximately 67.5-90 degrees. Tables such as that depicted in FIG. 24 can also be calculated for the second phase rotation and other phase rotations using the process depicted in FIG. 23 and the lookup table 160 shown in FIG. 22.

The combining unit 188 sums up the fractional phase signal from the multi-phase oscillator after rotation of the multi-phase signals by a phase rotation with the integer phase signal from the counter 118 to generate the phase signal. The phase signal is transmitted to the phase error signal generation unit 102.

The calibration block 186 is connected, for example, to the glitch correction unit 150 and the phase rotator 182. The calibration block receives glitch data regarding an amount of glitches from the glitch correction unit 150 and controls rotation of the multi-phase signal by the phase rotator 182 based on the amount of glitches. For example, the calibration block 186 can determine a number of glitches for a predetermined amount of time for a particular phase rotation of the multi-phase oscillator. Based on the amount of glitches for each phase rotation for the particular amount of time, the calibration block 186 can determine which phase rotation produces the least amount of glitches and set the phase rotator to rotate the multi-phase oscillator by such a phase rotation.

Figure 26:
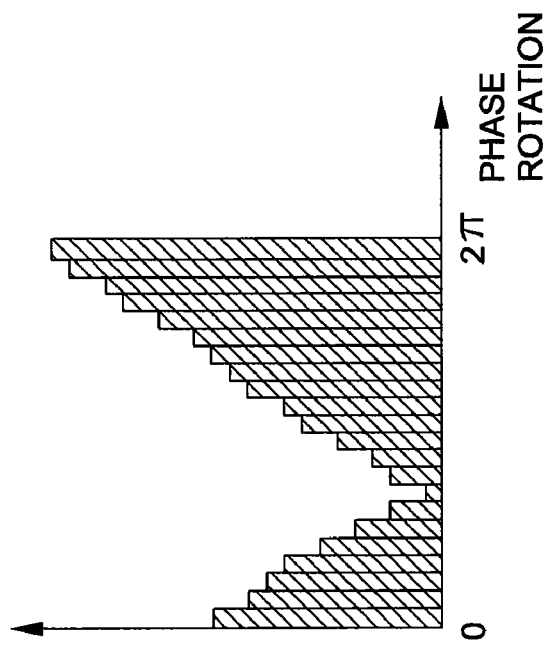
FIG. 26 is a graph illustrating a number of glitches for a phase rotation according to an embodiment of the present invention.
Figure 25:
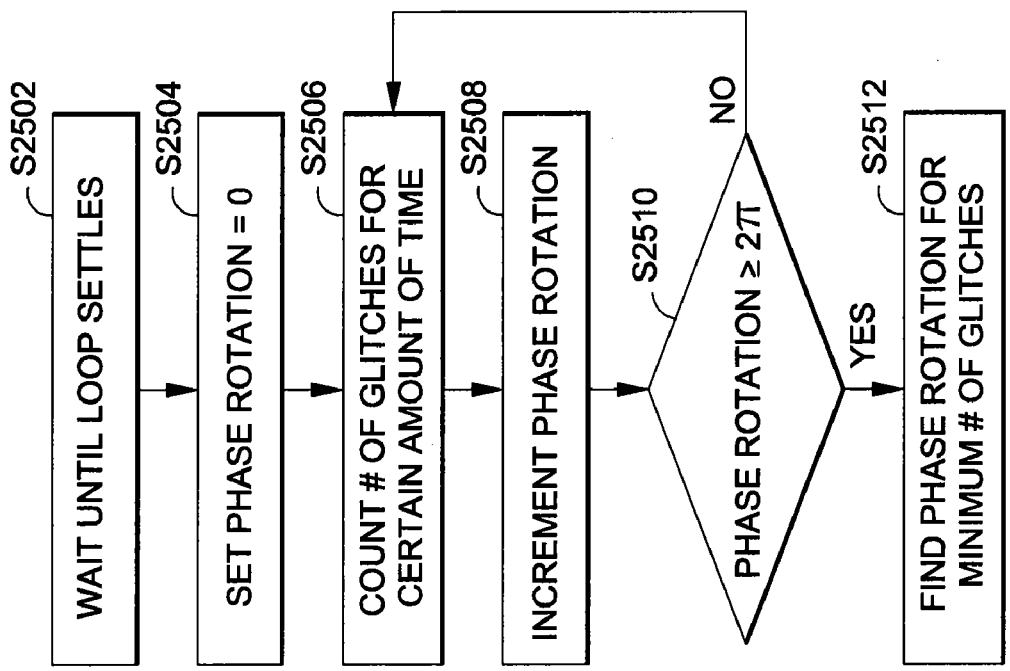
FIG. 25 is a process according to an embodiment of the present invention.

In one embodiment, the present invention is a process as seen in FIG. 25. In Step S2502, the process waits until the loop settles. For example, since the phase lock loop 300 (FIG. 21) locks onto the reference phase signal using a feedback loop, the glitch correction unit 150 (FIG. 21) is inactive until the phase lock loop 300 substantially locks onto the reference phase. In Step S2504, the phase rotation is set to 0. For example, the calibration block 186 instructs the phase rotator 182 to set the phase rotation of the multi-phase signal to 0. That is, the multi-phase signal is not rotated. In Step S2506, the number of glitches for a certain amount of time is counted. For example, the calibration block 186 receives the glitch data from the glitch correction unit 150 indicating an amount of glitches in the phase error signal. The glitch data can be used, for example, to generate a glitch graph as shown in FIG. 26 for the particular phase rotation of the multi-phase signal.

In Step S2508, a phase rotation is incremented. For example, the calibration block 186 instructs the phase rotator 182 to increase the phase rotation of the multi-phase signal. In Step S2510, a determination is made as to whether the phase rotation is greater than or equal to $2\pi$ radians. For example, the calibration block 186 determines if the phase rotation of the multi-phase signal is less than $2\pi$ or not. If the phase rotation of the multi-phase signal is less than $2\pi$ radians, then the multi-phase signal has not been completed rotated. Otherwise, if the multi-phase signal is greater than or equal to $2\pi$ radians, then the multi-phase signals have been completely rotated once. If the phase rotation is less than $2\pi$ radians, then the process repeats at Step S2506. Otherwise the process proceeds to Step S2512.

In Step S2512, a determination is made to find the phase rotation with the minimum number of glitches. For example, the calibration block 186 can use the glitch graph shown in FIG. 26 to determine which phase rotation has the minimum number of glitches. The calibration block 186 can then instruct the phase rotator 182 to rotate the multi-phase signal by the rotation which has the minimum number of glitches.

Those of ordinary skill would appreciate that the various illustrative logical blocks, modules, and algorithm steps described in connection with the examples disclosed herein may be implemented as electronic hardware, computer software, or combinations of both. Furthermore, the present invention can also be embodied on a machine readable medium causing a processor or computer to perform or execute certain functions.

To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The various illustrative logical blocks, units, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem. In the alternative, the processor and the storage medium may reside as discrete components in the wireless modem.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. An all digital phase lock loop comprising:
  a phase error signal generation unit generating a phase error signal including a plurality of phase error data; and
  a glitch correction unit connected to the phase error signal generation unit and configured to remove glitches in the phase error signal wherein the glitch correction unit computes a difference between a first phase error data and a second phase error data in the plurality of phase error data, by subtracting or adding a predetermined error value.

2. The all digital phase lock loop of claim 1 wherein the first phase error data and the second phase error data are consecutive phase error data.

3. The all digital phase lock loop of claim 1 wherein the glitch correction unit is deactivated when the glitch correction unit has substantially completed removing glitches in the phase error signal.

4. An all digital phase lock loop comprising:
a phase error signal generation unit generating a phase error signal including a plurality of phase error data; and
a glitch correction unit connected to the phase error signal generation unit and configured to remove glitches in the phase error signal,
wherein each of plurality of phase error data includes an integer phase error component and a fractional phase error component, and the glitch correction unit removes the glitches in the phase error signal by removing the integer phase error component in each of the plurality of phase error data.

5. An all digital phase lock loop comprising
a phase error signal generation unit generating a phase error signal including a plurality of phase error data;
a glitch correction unit connected to the phase error signal generation unit; and configured to remove glitches in the phase error signal; and
a calibration block connected to the glitch correction unit and counting a number of glitches in the phase error signal for a predetermined period of time.

6. The all digital phase lock loop of claim 5 further comprising:
a phase rotator connected to the calibration block and rotating a multi-phase signal by one of a plurality of phase rotations based on the number of glitches in the phase error signal.

7. The all digital phase lock loop of claim 6 further comprising:
a multi-phase oscillator connected to the phase rotator and generating the multi-phase signal.

8. The all digital phase lock loop of claim 7 wherein the calibration block counts a number of glitches in the phase error signal for the predetermined period of time for each of the plurality of phase rotations.

9. The all digital phase lock loop of claim 8 wherein the phase rotator rotates the multi-phase signal by the one of the plurality of phase rotations with a lowest number of glitches in the phase error signal.

10. The all digital phase lock loop of claim 7 further comprising a counter connected to the multi-phase oscillator and generating an integer phase data, wherein the counter is deactivated when the glitch correction unit has substantially completed removing glitches in the phase error signal.

11. An all digital phase lock loop comprising:
a multi-phase oscillator generating a multi-phase signal;
a phase rotator connected to the multi-phase oscillator and rotating the multi-phase signal by one of a plurality of phase rotations; and
a calibration block connected to the phase rotator and counting a number of glitches in a phase error signal for a predetermined period of time for each of the plurality of phase rotations.

12. The all digital phase lock loop of claim 11 wherein the phase rotator rotates the multi-phase signal by the one of the plurality of phase rotations with a lowest number of glitches in the phase error signal.

13. The all digital phase lock loop of claim 11 further comprising a fractional phase look up table connected to the phase rotator, the fractional phase look up table indicating a fractional phase signal corresponding to the rotated multi-phase signal.

14. A method for removing glitches in a phase error signal comprising:
generating a phase error signal including a plurality of phase error data;
correcting one or more of the plurality of phase error data to remove the glitches in the phase error signal by computing a difference between a first phase error data and a second phase error data in the plurality of phase error data; and
correcting the second phase error data if the difference between the first phase error data and the second phase error data is greater than a predetermined phase error value threshold by subtracting or adding a predetermined error value.

15. The method of claim 14 wherein the first phase error data and the second phase error data are consecutive phase error data.

16. A method for removing glitches in a phase error signal comprising:
generating a phase error signal including a plurality of phase error data; and
correcting one or more of the plurality of phase error data to remove the glitches in the phase error signal, wherein a phase error data from the plurality of phase error data is corrected if the phase error data is greater than a predetermined phase error value threshold by subtracting or adding a predetermined error value and removing an integer phase error component in the phase error data to remove the glitches in the phase error signal.

17. A method for removing glitches in a phase error signal comprising:
generating a phase error signal including a plurality of phase error data;
correcting one or more of the plurality of phase error data to remove the glitches in the phase error signal; and
counting a number of glitches in a phase error signal for a predetermined period of time.

18. The method of claim 17 further comprising rotating a multi-phase signal by one of a plurality of phase rotations based on the number of glitches in the phase error signal.

19. The method of claim 18 further comprising counting the number of glitches in the phase error signal for the predetermined period of time for each of the plurality of phase rotations.

20. The method of claim 19 further comprising rotating the multi-phase signal by the one of the plurality of phase rotations with a lowest number of glitches in the phase error signal.

21. The method of claim 17 further comprising using a glitch correction unit to remove the glitches in the phase error signal, using a counter to generate integer phase data, and deactivating the counter when the glitch correction unit has substantially removed the glitches in the phase error signal.

22. A method for removing glitches in a phase error signal comprising
generating a multi-phase signal;
rotating the multi-phase signal by one of a plurality of phase rotations; and
counting a number of glitches in a phase error signal for a predetermined period of time for each of the plurality of phase rotations.

23. The method of claim 22 further comprising rotating the multi-phase signal by the one of the plurality of phase rotations with a lowest number of glitches in the phase error signal.

24. The method of claim 23 further comprising determining a fractional phase signal corresponding to the rotated multi-phase signal.

* * * * *